US008963634B2

United States Patent
Srivastava et al.

(10) Patent No.: US 8,963,634 B2
(45) Date of Patent: Feb. 24, 2015

(54) LOAD CURRENT SENSING

(75) Inventors: Ankit Srivastava, San Diego, CA (US); Matthew D. Sienko, San Diego, CA (US); Meysam Azin, San Diego, CA (US); Xiaohong Quan, San Diego, CA (US); Peter J. Shah, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 417 days.

(21) Appl. No.: 13/406,775

(22) Filed: Feb. 28, 2012

(65) Prior Publication Data

US 2013/0223649 A1    Aug. 29, 2013

(51) Int. Cl.
*H03F 3/04* (2006.01)
*H03F 3/217* (2006.01)
*H03F 1/04* (2006.01)
*H03F 99/00* (2009.01)
*H03G 3/20* (2006.01)
*H03G 11/00* (2006.01)

(52) U.S. Cl.
USPC .......... 330/250; 330/207 A; 330/251; 381/58; 381/55; 381/120

(58) Field of Classification Search
CPC ......... H03F 1/523; H03F 3/2173; H03F 1/52; H03F 3/217; H03F 3/45179; H03F 3/45183; H03F 3/45475; H03F 2203/45526; H03F 2200/462; H03F 2200/471; H03F 2200/481; H03F 2203/45522; H03F 2200/426
USPC ............ 381/55, 58, 120; 330/10, 207, 207 A, 330/207 B, 250–253, 269, 277, 279
See application file for complete search history.

(56) References Cited

U.S. PATENT DOCUMENTS

| | | |
|---|---|---|
| 5,285,143 A | 2/1994 | Bahr et al. |
| 5,406,223 A | 4/1995 | Vulih et al. |

(Continued)

FOREIGN PATENT DOCUMENTS

| | | |
|---|---|---|
| EP | 2284992 A1 | 2/2011 |
| WO | 2007009482 A1 | 1/2007 |
| WO | 2007087586 A2 | 8/2007 |

OTHER PUBLICATIONS

Texas Instruments, "A differential Op-Amp Circuit Collection", Jul. 2001.*

(Continued)

*Primary Examiner* — Vivian Chin
*Assistant Examiner* — David Ton
(74) *Attorney, Agent, or Firm* — James Gutierrez

(57) ABSTRACT

Techniques for sensing current delivered to a load by a differential output stage, e.g., in a Class D amplifier. In one aspect, voltages across sense resistors coupled in series with first and second branches of the differential output stage are low-passed filtered and digitized. The sense resistors may be coupled in series with the sources of transistors of the first and second branches, wherein the transistors are selectively switchable on and off by input voltage driving voltages. The input driving voltages may correspond to a ternary voltage waveform such that during a given phase, the two transistors coupled in series with the sense resistors may be turned off. Further aspects provide for the first and second branches having cascoded NMOS and/or PMOS transistors, and the sense resistors being provided between a pair of cascoded transistors.

18 Claims, 9 Drawing Sheets

(56) References Cited

U.S. PATENT DOCUMENTS

| | | | |
|---|---|---|---|
| 5,410,592 | A | 4/1995 | Wagner et al. |
| 6,414,549 | B1 | 7/2002 | Barbetta |
| 6,492,845 | B1 | 12/2002 | Ge et al. |
| 6,624,698 | B2 * | 9/2003 | Nagaraj ............... 330/258 |
| 6,972,625 | B2 | 12/2005 | Nguyen et al. |
| 7,075,373 | B2 | 7/2006 | Briskin et al. |
| 7,113,590 | B2 | 9/2006 | Apfel |
| 7,157,968 | B2 * | 1/2007 | Shin ..................... 330/251 |
| 7,254,229 | B2 | 8/2007 | Apfel |
| 7,327,130 | B1 | 2/2008 | Giannopoulos et al. |
| 7,330,069 | B2 | 2/2008 | Yamamura et al. |
| 7,345,465 | B2 | 3/2008 | Dequina et al. |
| 7,382,190 | B2 | 6/2008 | Gilbert |
| 7,619,477 | B2 | 11/2009 | Segarra |
| 7,671,675 | B2 | 3/2010 | Miyashita et al. |
| 7,696,823 | B2 | 4/2010 | Khorramabadi |
| 7,768,311 | B2 | 8/2010 | Rathi et al. |
| 7,782,139 | B2 | 8/2010 | Gilbert |
| 7,848,724 | B2 | 12/2010 | Bult et al. |
| 7,920,026 | B2 | 4/2011 | Hughes |
| 7,984,199 | B2 | 7/2011 | Ferguson et al. |
| 8,009,824 | B2 | 8/2011 | Wu et al. |
| 8,018,287 | B2 | 9/2011 | Shimamoto et al. |
| 2010/0231266 | A1 | 9/2010 | Kishor |
| 2010/0237940 | A1 | 9/2010 | Gilbert |
| 2011/0012677 | A1 * | 1/2011 | Dooper et al. ............. 330/251 |
| 2012/0044020 | A1 * | 2/2012 | Siniscalchi et al. ........ 330/251 |

OTHER PUBLICATIONS

Springer.com, "On chip resistors and capacitors", Apr. 21, 2007; pp. 67-94.*

Berkhout, "An Integrated 200-W Class-D Audio Amplifier," IEEE Journal of Solid-State Circuits, vol. 38, No. 7, Jul. 2003, pp. 1198-1206.

Chen, et al., "Integrated Class-D Amplifier With Active Current ing Suitable for Alternating Current Switches," IEEE Transactions on Industrial Electronics, vol. 55, No. 8, Aug. 2008, pp. 3141-3149.

Mammano, "Current Sensing Solutions for Power Supply Designers," Texas Instruments, 2001, pp. 1-1 to 1-34.

Marco Berkhout, "Integrated Overcurrent Protection System for Class-D Audio Power Amplifiers", IEEE journal of solid-state circuits, vol. 40, No. 11, Nov. 2005, pp. 2237-2245.

Nikolic, et al., "Sense Amplifier-Based Flip-Flop," 1999 IEEE International Solid-State Circuits Conference, ISCC99 / Session 16 / Paper TP 16.5, pp. 282-283, 468.

Sherman, "Class D amplifiers provide high efficiency for audio systems," EDN Access for Design, by Design, May 25, 1995, pp. 1-5.

Torres, et al., "A 470uW Clock-Free Current-Controlled Class D Amplifier with 0.02% THD+N and 82dB PSRR," IEEE, 2010, pp. 326-329.

Walker, "A Class B Switch-Mode Assisted Linear Amplifier," IEEE Transactions on Power Electronics, vol. 18, No. 6, Nov. 2003, pp. 1278-1285.

Beck, S., et al., "A New Power-Consumption Optimization Technique for Two-Stage Operational Amplifiers", IEICE Transactions on Electronics, Institute of Electronics, Tokyo, JP, vol. E94C, No. 6, Jun. 1, 2011, pp. 1138-1140, XP00156497.

International Search Report and Written Opinion—PCT/US2013/028446—ISA/EPO—Jul. 3, 2013.

Nagari, A., et al., "An 8 2.5W 1%-THD 104dB (A)-dynamic-range Class-D audio amplifier with an ultra-low EMI system current sensing for speaker protection", Solid-State Circuits Conference Digest Technical Papers (ISSCC), 2012 IEEE International, IEEE, Feb. 19, 2012, pp. 92-94, XP032154363.

\* cited by examiner

LOAD CURRENT SENSING

BACKGROUND

1. Field

The disclosure relates to current sensing in electronic circuitry, and in particular, to sensing current flow delivered to a load.

2. Background

Cellular phones and other portable consumer devices commonly incorporate one or more speakers to generate audio output, such as voice, for a user. Class D speaker drivers are typically used to deliver maximum power to the speakers. The miniature speakers used in such portable devices are generally not robust, and may readily fail when, e.g., operated outside of a pre-specified temperature range. To prevent overheating of a speaker, circuitry may be provided to measure the operating current through the speaker, or more generally, the load. The temperature of the speaker may then be estimated by taking into account both the measured operating current and the speaker impedance, and appropriate measures may be taken when the temperature falls outside the allowable range.

To monitor the operating current, one or more external sense resistors may be placed in series with the load, and the voltage across such sense resistors may in turn be detected, e.g., by a voltage amplifier. Sensing the voltage across the sense resistors may be complicated when the signal voltages used to drive the speaker are switched on and off over multiple phases of a cycle, for example, according to a Class D amplifier scheme. During one or more of such multiple phases, the current flowing through the load may not correspond to the current flowing through the sense resistors. To accurately measure speaker current, it is necessary to account for such multiple phases when measuring the sense resistor voltages.

It would be desirable to provide simple and robust techniques for sensing load current that can accommodate loads driven by multi-phase driving voltages or other types of driving voltages.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

While exemplary embodiments of the present disclosure are described herein with reference to a speaker being the load to which current is delivered, it will be appreciated that the same techniques may also readily be applied to accommodate other types of loads (e.g., non-audio loads). Such alternative exemplary embodiments are contemplated to be within the scope of the present disclosure.

Figure 1:
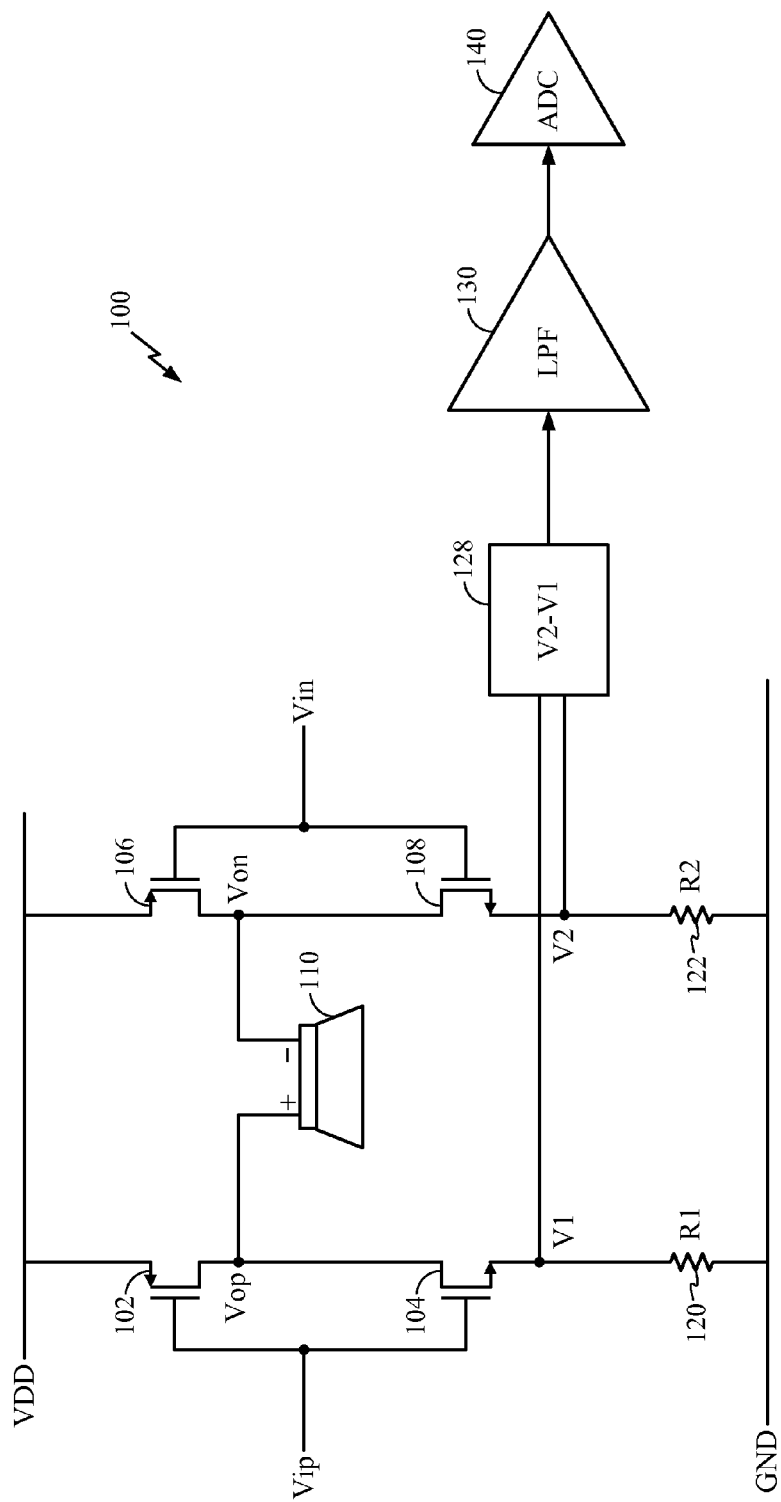
FIG. 1 illustrates an exemplary embodiment of the present disclosure.

FIG. 1 illustrates an exemplary embodiment 100 of the present disclosure. In FIG. 1, plus (+) and minus (−) terminals of a speaker 110 are driven by a differential output stage having a first driving branch that includes transistors 102, 104 and a second driving branch that includes transistors 106, 108. The first and second driving branches are driven by input signal voltages Vip and Vin, respectively, to control the electrical signal provided to the speaker 110. The output voltages of the first and second driving branches, Vop and Vin, respectively, may directly drive the speaker 110.

As further described hereinbelow with reference to FIGS. 3A, 3B, transistors 102, 104, 106, 108 may be selectively turned on and off by the input driving voltages Vip, Vin according to a Class D amplifier scheme, thereby coupling the individual terminals of speaker 110 alternately to VDD or GND to generate an audio signal. Depending on the configuration of Vip, Vin, either of transistors 102, 104, and either of transistors 106, 108 may be sinking or sourcing current at any time. Coupled to the sources of the NMOS transistors 104, 108 are first and second sense resistors 120, 122, respectively, also denoted as R1 and R2. In an exemplary embodiment, R1 and R2 may have the same resistance. It will be appreciated that by being placed in series with the sources of transistors 104, 108, respectively, R1 and R2 support the same currents that flow through those transistors. In particular, the voltage V1 at the source of transistor 104, also corresponding to the voltage drop across R1 (as the other end of R1 is coupled to ground), may be used to calculate the current flowing through transistor 104. Similarly, the voltage V2 at the source of transistor 108, also corresponding to the voltage drop across R2, may be used to calculate the current flowing through transistor 108.

In the exemplary embodiment shown, the voltages V1, V2 are coupled to a subtraction circuit 128 for computing the difference V2−V1 (or alternatively, V1−V2), and then to a differential low-pass filter/amplifier 130 (also denoted LPF in FIG. 1), whose output may (optionally) be digitized by an analog-to-digital converter (ADC) 140. The LPF 130 may, e.g., low-pass filter the difference between voltages V1 and V2, and provide further buffering/amplification to the filtered signal prior to digitization.

Figure 2:
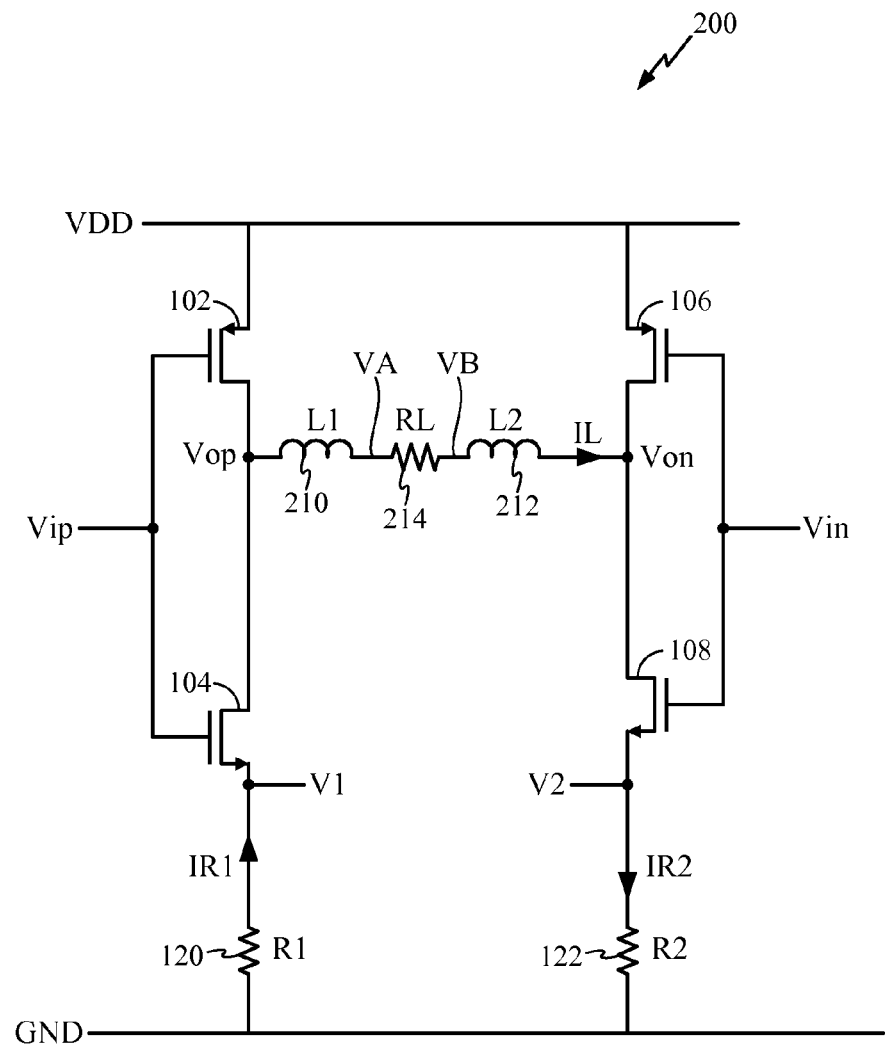
FIG. 2 further illustrates the apparatus of FIG. 1, showing in more detail various electrical circuit elements that are present.

FIG. 2 further illustrates the apparatus 100 of FIG. 1, showing in more detail various electrical circuit elements that are present. Note, for simplicity, the subtraction circuit 128, LPF 130, and ADC 140 of FIG. 1 are not shown in FIG. 2. In particular, inductances 210, 212, also denoted L1, L2, are shown coupling the outputs of the differential output stage to the speaker, which is represented in FIG. 2 by a load resistance 214, or RL. Voltages VA and VB correspond to the voltages present at the nodes coupling L1 to RL, and L2 to RL, respectively. Further shown in FIG. 2 are the current IR1 flowing through the source of transistor 104, and the current IR2 flowing through the source of transistor 108. Note the directionality of the currents IR1 and IR2 as indicated in FIG. 2.

Figure 3A:
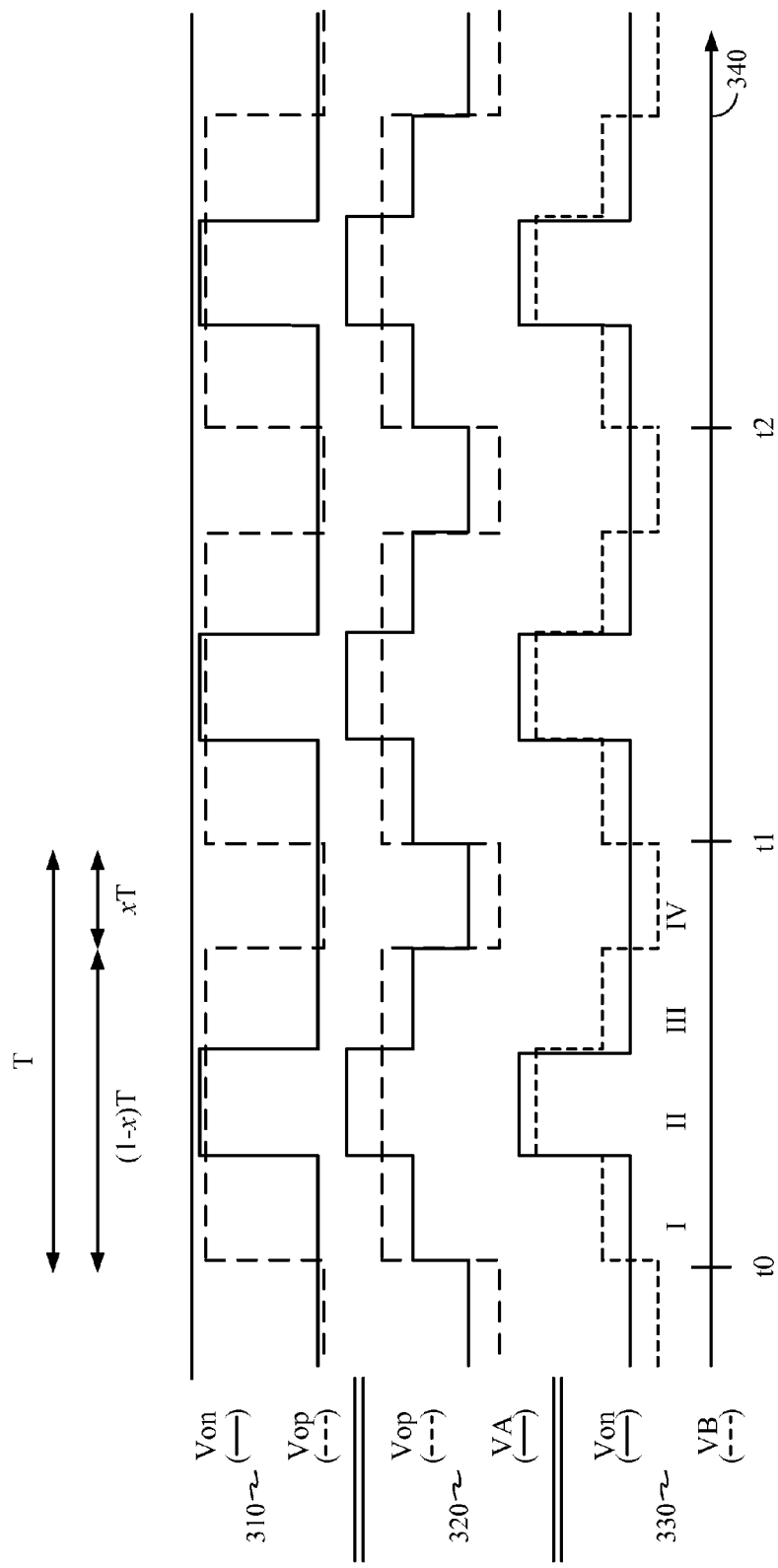
FIGS. 3A and 3B illustrate signal waveforms present in the circuitry according to an exemplary embodiment of the present disclosure.
Figure 3B:
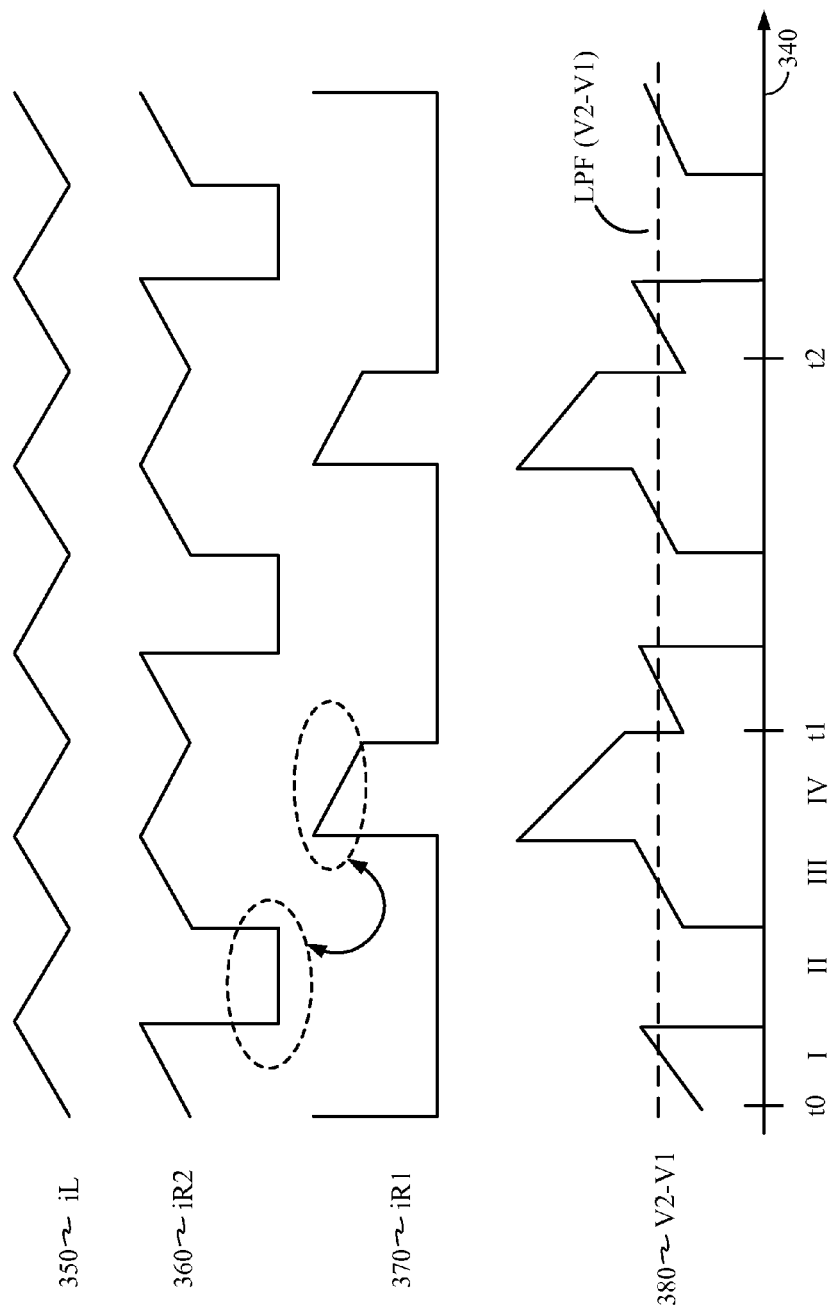

FIGS. 3A and 3B illustrate signal waveforms present in the circuitry 200 according to an exemplary embodiment of the present disclosure, wherein the input voltages Vin and Vip are driven according to a ternary driving scheme to generate output voltages Von and Vop, as further described hereinbelow. In particular, plots 310, 320, 330, 350, 360, 370, 380 are all shown as progressing along a time axis 340.

Plot 310 shows exemplary voltage sequences for Von and Vop. It will be appreciated that the voltage sequences for Vin and Vip (not shown) may correspond to the inverse of Von and Vop, respectively, as each of the driving branches may be understood to perform an inverting function. Each of Von and Vop is cyclically driven, with each cycle arbitrarily divided into four phases I, II, III, and IV, as labeled in FIG. 3A for the cycle from time t0 to t1, with period T=t1−t0. It may be seen that, over the course of one cycle of the driving voltage sequences, Vop remains high for phases I, II, and III, and is low for phase IV. Von, on the other hand, is high only during phase II, and low for the rest of the cycle. It is noted that Von and Vop are both high during phase II, and both low during phase IV, while one is high and one is low during phases I and III. As shown in plot 310, the duration of phase IV is denoted as x·T, wherein x is a fraction from 0 to 1, while the combined duration of phases I, II, and III is correspondingly denoted as (1−x)·T. In an exemplary embodiment, the duration of phase II may be identical to that of phase IV.

Note that the sequence of the phases I, II, III, and IV as illustrated in FIG. 3A is for exemplary purposes only, and the phases may be readily be re-ordered, re-arranged, and may incorporate additional phases not shown, etc., as will be recognized by one of ordinary skill in the art. Such alternative exemplary embodiments are contemplated to be within the scope of the present disclosure.

Plot 320 compares Vop to VA, the voltage present at the node coupling L1 to RL, and plot 330 compares Von to VB, the voltage present at the node coupling L2 to RL. Plot 350 of FIG. 3B shows the change in iL, or the current through either inductor L1 or L2, over time. One of ordinary skill in the art will appreciate that, given the particular input voltages Von and Vop shown in plot 310, iL increases and decreases approximately linearly during each phase as shown in plot 350, and thus the voltages VA and VB in plots 320, 330 are correspondingly approximately constant during each phase.

Plot 360 further illustrates the current iR2 through R2 over time, and plot 370 illustrates the current iR1 through R1 over time. From FIG. 1, it may be seen that current only flows in R2 when Von is low, i.e., when transistor 108 is turned on, thus leading to the plot 360 of iR2 showing current flow in all phases except for phase II. Similarly, it may be seen that current only flows in R1 when Vop is low, i.e., when transistor 104 is turned on, thus leading to the plot 370 of iR1 showing current flow only in phase IV.

From the operation of the ternary driving scheme illustrated in plot 310, it may be seen that, during phase II, both PMOS transistors 102, 106 are turned on, while both NMOS transistors 104, 108 are turned off, leading to no current flow in resistors R1 and R2 during phase II. If the voltage drops across R1 and R2 (i.e., V1 and V2, respectively) are sampled during phase II, then V1 and V2 would indicate no voltage drop, even though current may be flowing through the load RL through PMOS transistors 102, 106 during phase II. Thus if instantaneous samples of V1 and V2 were to be used to indicate current flow through RL, then the voltage sampling mechanism would need to be provided with knowledge of the phase timing within each cycle, thus potentially complicating the design of the current sensing mechanism.

In an aspect of the present disclosure, explicit knowledge of the phase timing is rendered unnecessary for current sensing by means of the following observation. Referring again to plots 360 and 370 of FIG. 3B, it is seen from the circled portions (phase II of iR2 and phase IV of iR1) that the current "lost" from iR2 during phase II may in certain cases be approximately equal to the current flow in iR1 during phase IV, e.g., when the durations of phase II and IV are equal, and when R2=R1. Given this observation, it will be appreciated that the integral of the difference V2−V1 over one cycle (with plot 380 showing V2−V1) is the same as would be the case if the sense resistors R1, R2 actually registered the correct current flowing through the load RL during phase II. If the difference V2−V1 is provided to a low-pass filter (LPF) such as LPF 130 shown in FIG. 1, which effectively performs an integrating function, then it would be expected that the output of the LPF would be reasonably accurate in indicating the total current flow through the load RL.

To ensure integration, it will be appreciated that the bandwidth of such an LPF may be chosen to be suitably lower than the cyclical frequency of the ternary sequences described above, while nevertheless being high enough to accurately track overall variations in the load current.

One of ordinary skill in the art would appreciate that the above observation would apply not only to ternary waveforms having the structure as shown in plot 310, but also to a binary scheme wherein Von and Vop are simply inverses of one another, and not time-shifted as in the previously illustrated ternary scheme. Such alternative exemplary embodiments are contemplated to be within the scope of the present disclosure.

Figure 4:
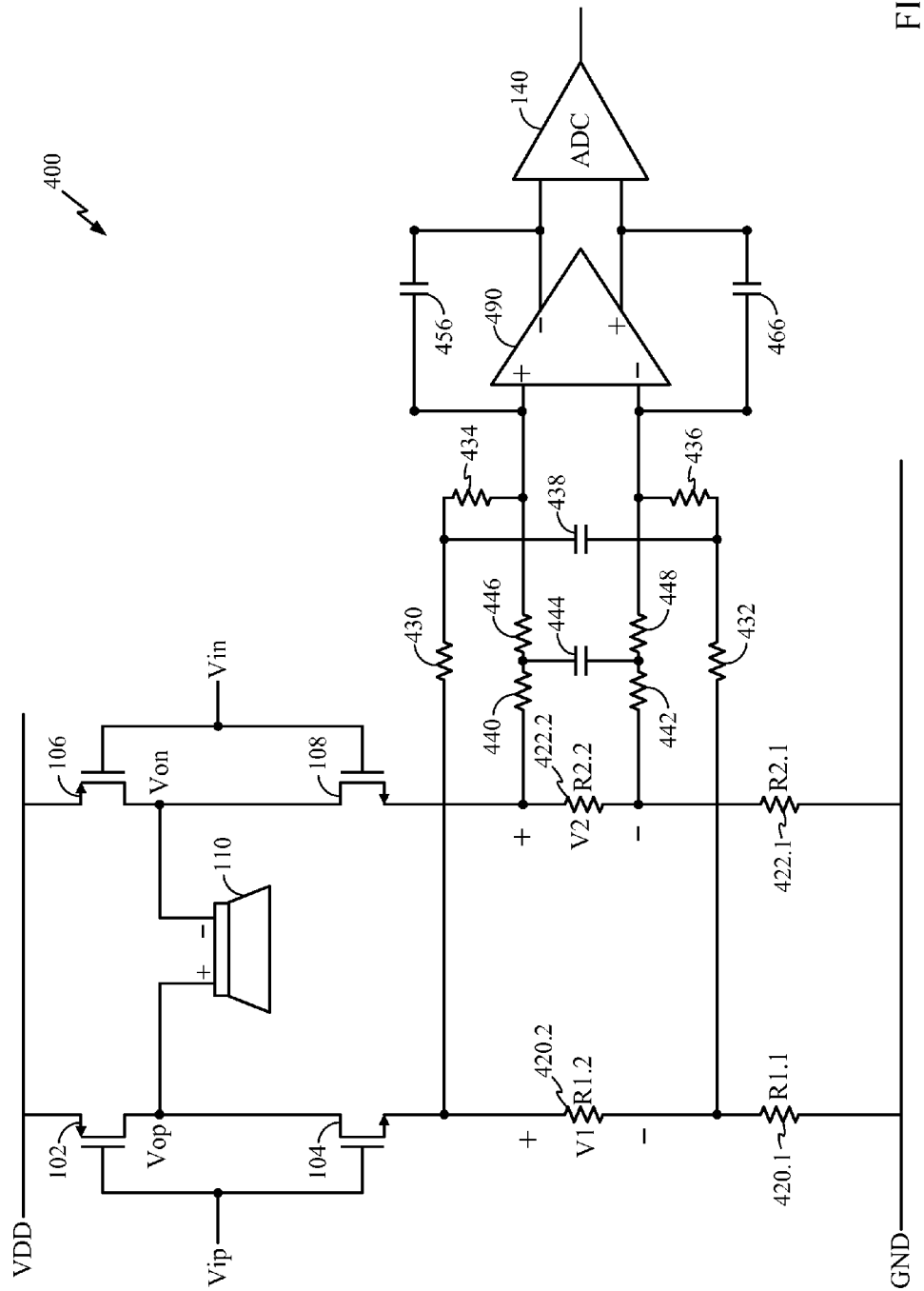
FIG. 4 illustrates an exemplary embodiment of an LPF in conjunction with the current sensing circuitry described hereinabove.

FIG. 4 illustrates an exemplary embodiment of an LPF in conjunction with the current sensing circuitry described hereinabove. Note the filtering components in FIG. 4 are shown for illustration only, and are not meant to limit the scope of the present disclosure to any particular embodiment of a low-pass filter.

In FIG. 4, it is noted that each of the sense resistors R1 and R2 are split into two resistances, with R1 being composed of 420.1 (R1.1) and 420.2 (R1.2), and R2 being composed of 422.1 (R2.1) and 422.2 (R2.2). The resistances R2.1 and R1.1 may represent, e.g., parasitic on-chip routing resistances. In an exemplary embodiment, the resistors 420.2 (R1.2) and 422.2 (R2.2) may be on-chip poly resistors, e.g., temperature invariant poly resistors that can be formed by a series/parallel combination of P+ and N+ resistors. Note that P+ and N+ poly resistors have opposite temperate coefficients, which may mutually cancel when the two types of resistors are used together.

The difference between the voltages across R1.2 and R2.2 is sensed and low-pass filtered by a differential amplifier 490 coupled to RC networks as shown, including resistors 430, 434, 432, 436 and capacitor 438 for R1.2, and resistors 440, 446, 442, 448 and capacitor 444 for R2.2. One of ordinary skill in the art will appreciate that the RC networks may effectively perform low-pass filtering on the voltages V1 and V2, and thus the values of the resistances and capacitances may be chosen to appropriately set the bandwidth of the low-pass filter. In the feedback path of the differential amplifier 490 are also provided capacitors 456, 466.

While certain exemplary embodiments have been described hereinabove with reference to sense resistors R1, R2 being provided at the source of NMOS transistors 104, 108, it will be appreciated that sense resistors may alternatively, or additionally, be provided at the source of PMOS transistors 102, 106, and such alternative exemplary embodiments are contemplated to be within the scope of the present disclosure.

Figure 5:
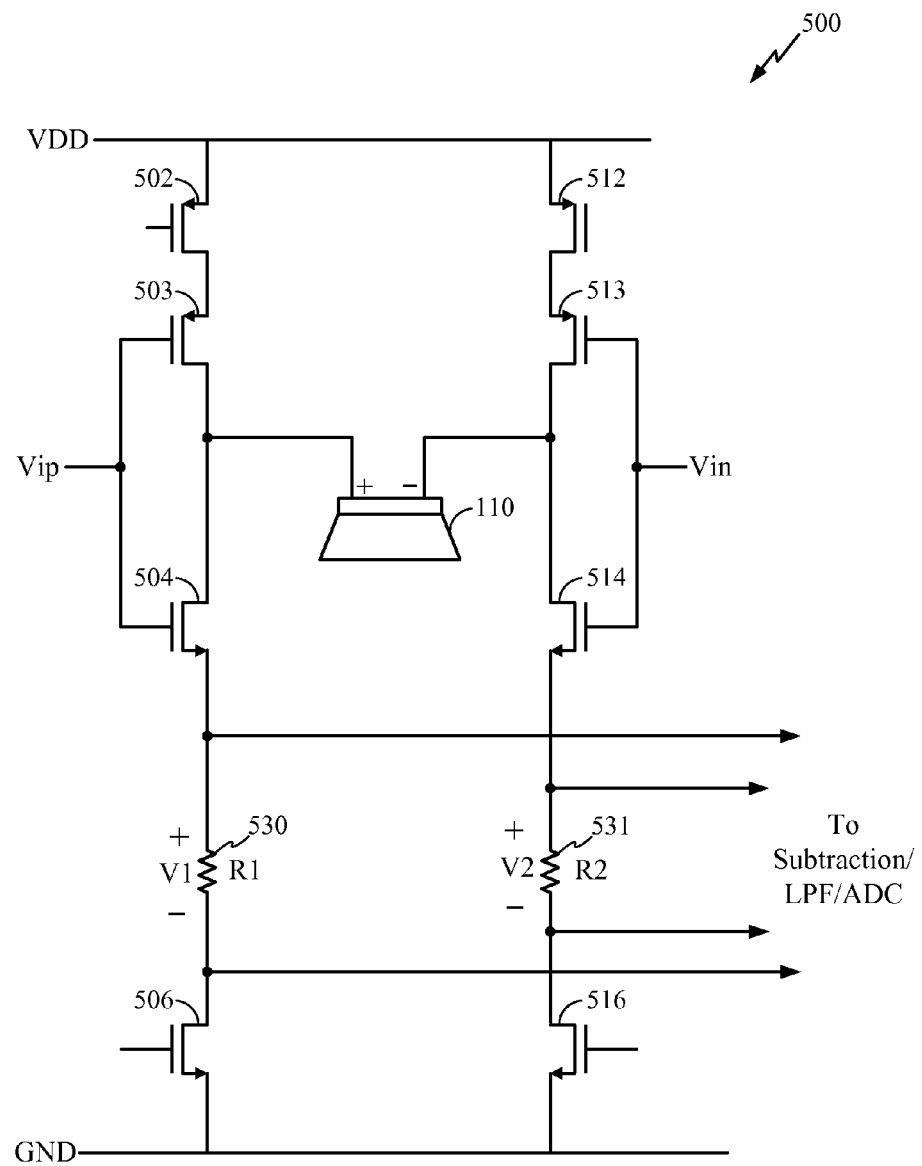
FIG. 5 illustrates an alternative exemplary embodiment of the present disclosure, wherein a cascode configuration is utilized for the output stage driving branches.

FIG. 5 illustrates an alternative exemplary embodiment of the present disclosure, wherein a cascode configuration is utilized for the output stage driving branches. In particular, a first driving branch includes cascoded PMOS transistors 502, 503 and cascoded NMOS transistors 504, 506, and a second driving branch includes cascoded PMOS transistors 512, 513 and cascoded NMOS transistors 514, 516. In FIG. 5, a sense resistor 530 (R1) for the first driving branch is provided in series between cascoded transistors 504, 506, while a sense resistor 531 (R2) for the second driving branch is provided in series between cascoded transistors 514, 516. The voltages V1, V2 across resistors R1, R2 may be sensed and provided to an LPF/ADC (not shown in FIG. 5) as earlier described hereinabove to sense the current through the load.

It will further be appreciated that the sense resistors R1, R2 may also be alternatively, or additionally, provided between cascoded transistors 502, 503 and 512, 513. In such an embodiment, the voltage drops across the sense resistors would also be sensed and provided to a subtraction circuit and low-pass filter, similarly as described for the embodiment of FIG. 5. Such alternative exemplary embodiments are contemplated to be within the scope of the present disclosure.

Figure 6:
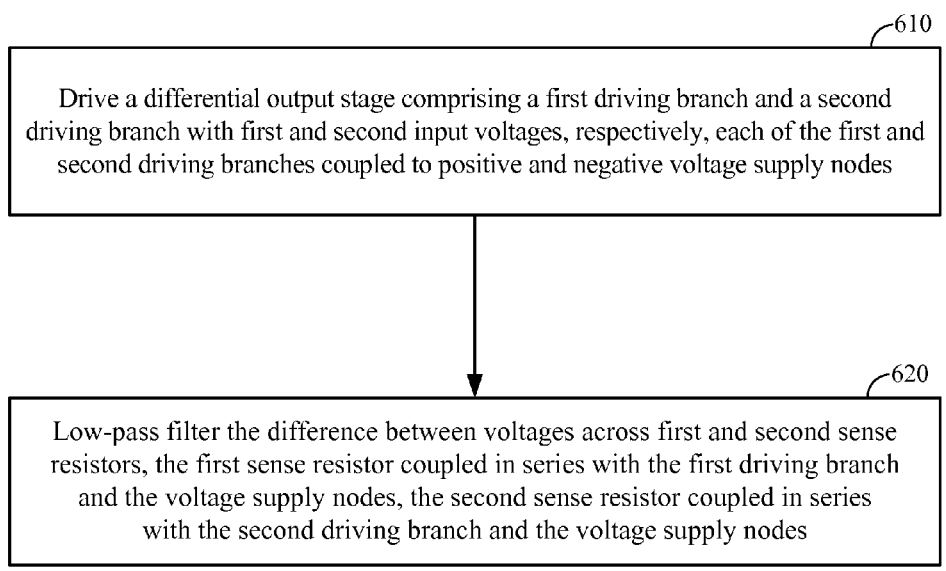
FIG. 6 illustrates an exemplary embodiment of a method according to the present disclosure.

FIG. 6 illustrates an exemplary embodiment of a method according to the present disclosure. It will be appreciated that the method is described for illustrative purposes only, and is not meant to limit the scope of the present disclosure to any particular method explicitly shown.

In FIG. 6, at block 610, a differential output stage comprising a first driving branch and a second driving branch with first and second input voltages, respectively, is driven. Each of the first and second driving branches is coupled to positive and negative voltage supply nodes. A first sense resistor is coupled in series with the first driving branch and the voltage supply nodes, while a second sense resistor is coupled in series with the second driving branch and the voltage supply nodes.

At block 620, the difference between voltages across first and second sense resistors is low-pass filtered.

Figure 7:
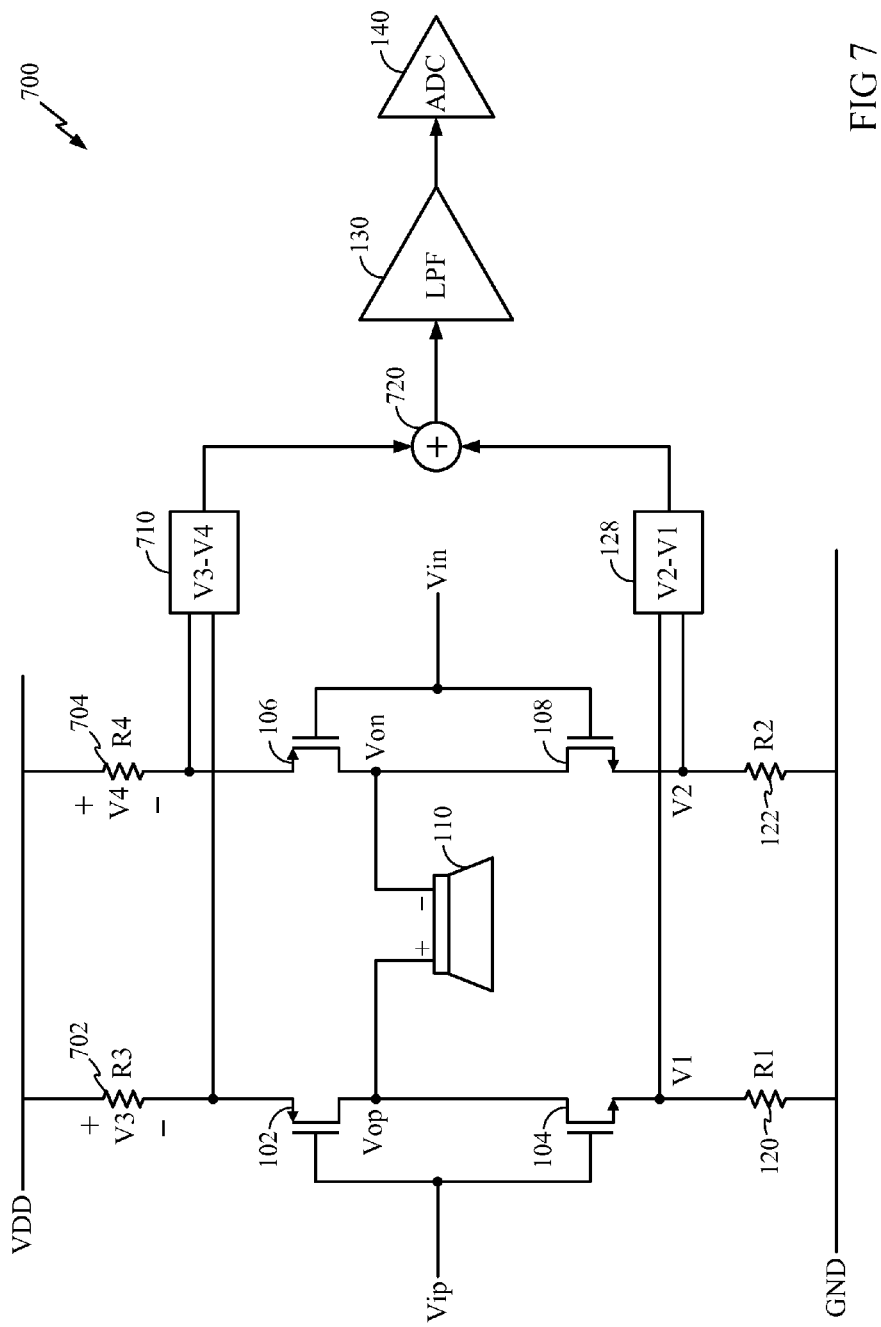
FIG. 7 illustrates an alternative exemplary embodiment of the present disclosure, showing sense resistors coupled to the sources of both PMOS and NMOS transistors.

FIG. 7 illustrates an alternative exemplary embodiment 700 of the present disclosure, showing sense resistors coupled to the sources of both PMOS and NMOS transistors. Note similarly labeled elements in FIGS. 1 and 7 may correspond to elements having similar functionality, unless otherwise noted.

In FIG. 7, sense resistors 702, 704 (also labeled "R3" and "R4") are provided at the sources of PMOS transistors 102, 106, respectively. The voltages across R3, R4, also denoted V3, V4, respectively, are provided to a subtraction circuit 710, which computes the difference V3−V4. The output of subtraction circuit 710 is added to the output of subtraction circuit 128 (earlier described hereinabove with reference to FIG. 1) using adder 720. The output of adder 720 is then provided to LPF 130, which performs filtering as previously described with reference to FIG. 1 hereinabove.

By providing sense resistors at the sources of both PMOS and NMOS transistors, current flow may advantageously be detected over all phases of the multi-phase cycle, as will be appreciated from the earlier description of FIGS. 3A and 3B. In an exemplary embodiment, the resistance of each of resistors R1-R4 in embodiment 700 may be half that of the resistance of resistors R1, R2 in embodiment 100, to maintain the same net series resistance of the sense resistors during each phase.

In an alternative exemplary embodiment (not shown), the single transistors 102, 104, 106, 108 in embodiment 700 may each be replaced by a pair of cascoded transistors. One of ordinary skill in the art will in fact appreciate that single transistors as shown and described throughout this specification and the drawings may generally be replaced by a pair of cascoded transistors. Such alternative exemplary embodiments are contemplated to be within the scope of the present disclosure.

Figure 8:
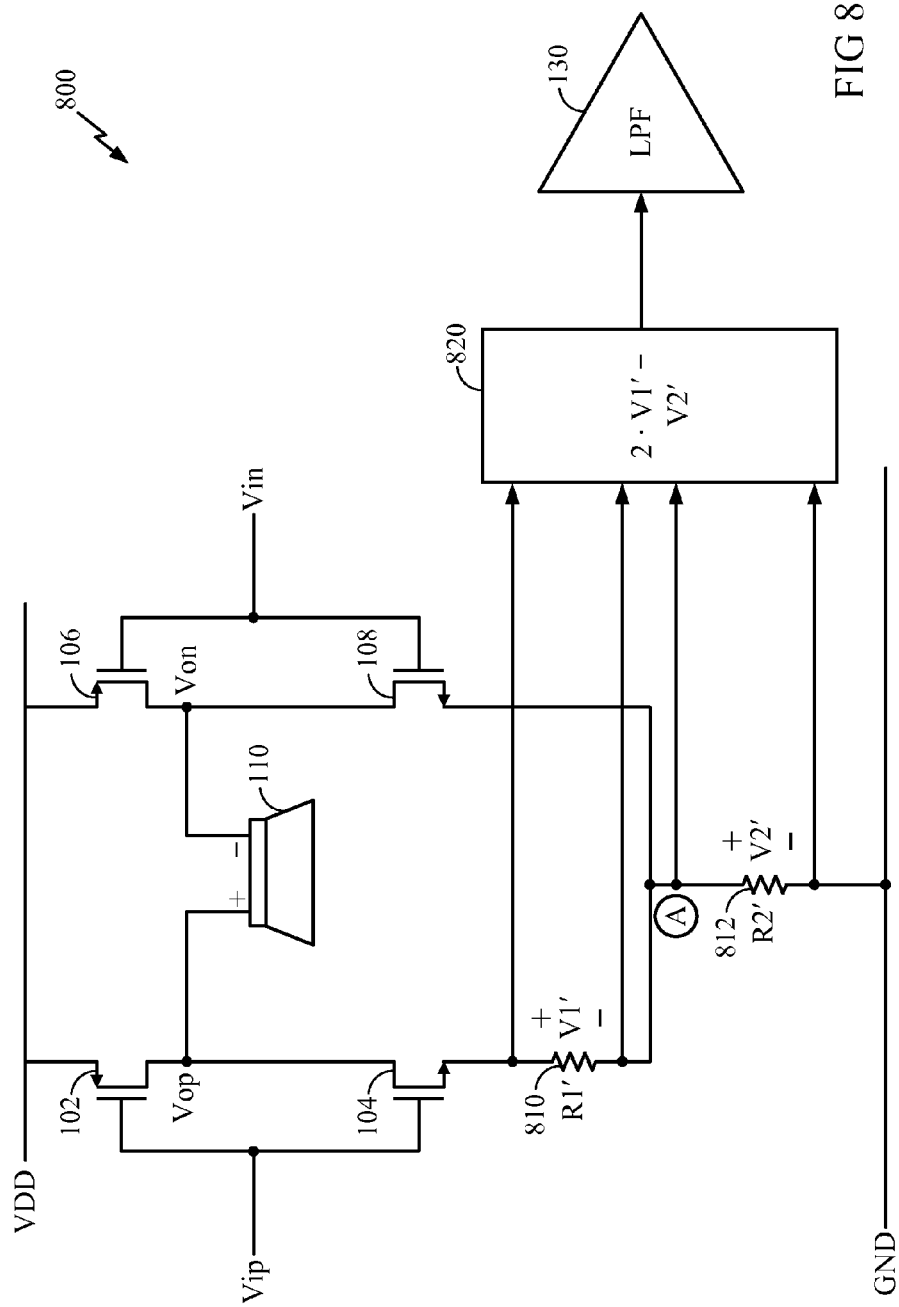
FIG. 8 illustrates an alternative exemplary embodiment according to the present disclosure, wherein a sense resistor R1' is asymmetrically provided in only one driving branch.

FIG. 8 illustrates an alternative exemplary embodiment 800 according to the present disclosure, wherein a sense resistor 810 or R1' is asymmetrically provided in only one driving branch. Note similarly labeled elements in FIGS. 1 and 8 may correspond to elements having similar functionality, unless otherwise noted.

In FIG. 8, sense resistor R1' is provided at the source of NMOS transistor 104. The sense resistor R1' and the source of the other NMOS transistor 108 are coupled to a common node A, which in turn is coupled to ground via a sense resistor 812 or R2'. The voltages V2' and V1' across R2' and R1', respectively, are provided to a calculation block 820, which may compute the value of 2·V1'−V2'. In an exemplary embodiment, the calculation block 820 may perform such calculation in the analog domain, using, e.g., operational amplifier circuitry such as shown in FIG. 4. Such a calculation block 820 may be implemented in various ways known to one of ordinary skill in the art, and will not be further described herein.

The operating principles of the embodiment 800 will be described hereinbelow. Referring again to plot 310 of FIG. 3A, it will be seen that the duration of time during each cycle wherein either of NMOS transistors 104, 108 (but not both) is conducting corresponds to the combined duration of phases I and III, or (1−2x)·T. The duration of time during each cycle wherein transistor 104 is conducting corresponds to the duration of phase IV, or x·T. Accordingly, the expressions for the voltages V1', V2', and the output of calculation block 820 are as follows:

$$V1'=(1-x)\cdot iL\cdot R1'; \quad \text{(Equation 1)}$$

$$V2'=(1-2x)\cdot iL\cdot R2'; \text{ and} \quad \text{(Equation 2)}$$

$$\text{Output of block } 820 = 2\cdot V1'-V2'=iL\cdot R(\text{assuming } R1'=R2'=R). \quad \text{(Equation 3)}$$

From Equation 3 above, it can be seen that the output of block 820 thus corresponds to an indication of the current to be measured, iL.

One of ordinary skill in the art will appreciate that placing the sense resistor R1' at the source of transistor 104 is shown for illustrative purposes only. Alternative exemplary embodiments may incorporate the sense resistor R1' at the source of any of transistors 102, 104, 106, 108, along with a sense resistor R2' at a common node corresponding to the embodiment showing in FIG. 8 for embodiment 800. Such alternative exemplary embodiments are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
    a differential output stage comprising a first driving branch and a second driving branch, each of the first and second driving branches coupled to positive and negative voltage supply nodes;
    a first sense resistor coupled in series with the first driving branch and the voltage supply nodes, the voltage across the first sense resistor corresponding to a first sense voltage;

a second sense resistor coupled in series with the second driving branch and the voltage supply nodes, the voltage across the second sense resistor corresponding to a second sense voltage; and a low-pass filter configured to filter the continuous-time difference between the first and second sense voltages.

2. The apparatus of claim 1, further comprising an analog-to-digital converter (ADC) coupled to the output of the low-pass filter.

3. The apparatus of claim 1, further comprising a load, the first and second driving branches configured to drive the load.

4. The apparatus of claim 1, the first and second driving branches being driven by first and second input voltages, respectively, such that:

during a first phase (I), the first input voltage is high and the second input voltage is low;

during a second phase (II), the first and second input voltages are high;

during a third phase (III), the first input voltage is low and the second input voltage is high; and during a fourth phase (IV), the first and second input voltages are low.

5. The apparatus of claim 4, wherein each of the phases are equal in duration.

6. The apparatus of claim 1, each of the first driving branch and the second driving branch comprising an NMOS transistor and PMOS transistor coupled as an inverter, the first and second sense resistors coupled to the sources of the NMOS transistors.

7. The apparatus of claim 1, each of the first and second sense resistors comprising a poly resistor or an N+ resistor or a P+ resistor.

8. The apparatus of claim 1, each of the first and second driving branches comprising cascoded PMOS transistors and cascoded NMOS transistors, the first and second sense resistor coupled in series between the cascoded NMOS transistors.

9. The apparatus of claim 1, each of the first and second driving branches comprising cascoded PMOS transistors and cascoded NMOS transistors, the first and second sense resistor coupled in series between the cascoded PMOS transistors.

10. The apparatus of claim 1, further comprising a speaker having first and second input nodes, each of the first and second driving branches having an output node, the output nodes of the first and second driving branches coupled to the speaker first and second input nodes to drive the speaker.

11. The apparatus of claim 1, the low-pass filter comprising a differential amplifier comprising differential inputs, the differential inputs coupled to the first and second sense resistors via a resistor-capacitor (RC) network, and the differential amplifier further comprising differential outputs, the differential outputs coupled to the differential inputs via at least one switchable resistance.

12. The apparatus of claim 1, the negative voltage supply node corresponding to a ground voltage.

13. A method comprising:

driving a differential output stage comprising a first driving branch and a second driving branch with first and second input voltages, respectively, each of the first and second driving branches coupled to positive and negative voltage supply nodes; and low-pass filtering the continuous-time difference between voltages across first and second sense resistors, the first sense resistor coupled in series with the first driving branch and the voltage supply nodes, the second sense resistor coupled in series with the second driving branch and the voltage supply nodes.

14. The method of claim 13, further comprising digitizing the output of the low-pass filter.

15. The method of claim 13, the driving with first and second input voltages comprising:

during a first phase (I), driving the first input voltage high and the second input voltage low;

during a second phase (II), driving the first and second input voltages high;

during a third phase (III), driving the first input voltage low and the second input voltage high; and during a fourth phase (IV), driving the first and second input voltages low.

16. The method of claim 13, each of the first driving branch and the second driving branch comprising an NMOS transistor and PMOS transistor coupled as an inverter, the first and second sense resistors coupled to the sources of the NMOS transistors.

17. The method of claim 13, each of the first and second driving branches comprising cascoded PMOS transistors and cascoded NMOS transistors, the first and second sense resistor coupled in series between the cascoded NMOS transistors.

18. The method of claim 13, the negative voltage supply node corresponding to a ground voltage.

* * * * *